United States Patent [19]

Heffernan

[11] 4,239,987
[45] Dec. 16, 1980

[54] SWITCHING CIRCUIT FOR CONTROLLING VARIOUS APPLIANCES

[75] Inventor: Patrick M. Heffernan, Scottsdale, Ariz.

[73] Assignee: Sumari Engineering, Tempe, Ariz.

[21] Appl. No.: 951,069

[22] Filed: Oct. 13, 1978

[51] Int. Cl.³ ............................................. H03K 17/72
[52] U.S. Cl. ................................ 307/252 B; 307/293; 323/24
[58] Field of Search ........... 307/252 B, 252 N, 252 T, 307/293; 323/24

[56] References Cited

U.S. PATENT DOCUMENTS

| 3,644,793 | 2/1972 | Ilk | 307/293 X |
| 3,745,382 | 7/1973 | Hoge et al. | 307/293 |
| 3,808,466 | 4/1974 | Campbell | 307/293 |
| 3,883,782 | 5/1975 | Beckwith | 307/252 B |

Primary Examiner—John Zazworsky
Attorney, Agent, or Firm—Harry M. Weiss

[57] ABSTRACT

This relates to an electronic circuit which is designed to supply 115 volts AC power to loads of up to 550 watts for a predetermined time period of wide latitude. An "on" cycle is initiated by momentary closure of an external control line pair with a closed contact current flow of less than one half milliampere. The "on" controller may be located at any convenient distance from the load switching circuit and may be a coin operated switch. The electronic power control circuit is fabricated from discrete components including one integrated circuit installed on a printed circuit board (1⅞"×2⅞") which is finally encapsulated in a hermetically sealed 2"×3" module suitable for operation in a moist or corrosive environment.

7 Claims, 3 Drawing Figures

SWITCHING CIRCUIT FOR CONTROLLING VARIOUS APPLIANCES

BACKGROUND OF THE INVENTION

1. Field of the Invention

This invention relates generally to electronic circuits designed to exercise a control function by turning on small motors, heaters, water valves, etc. related to car washing machinery, laundry machinery, fluid dispensers or any other unattended equipment which can be controlled by deposit of coins for sale of a service of predetermined duration.

2. Description of the Prior Art

In the past and to a great extent at present, appliance controls requiring timed on-off cycles incorporate composite electromechanical switches consisting usually of a time-delay secondary relay controlling a primary contactor which accomplishes the power switching function. Design of the secondary relay depends on time interval considerations. Orificed pneumatic or hydraulic dash-pot arrangements are used for delays of 30 seconds to several minutes while switch contactors driven by synchronous clock motors can be used for "on" or "off" cycles of 30 seconds to weeks or even months. Bimetallic thermal switches with fixed or variable time intervals based on thermal inertia have also been successfully used for secondary controls.

As highly reliable and comparatively low-priced semiconductor products became available, it became practical to construct all electronic counterparts of many types of electromechanical controllers. Such electronic counterparts are in most cases cheaper and more reliable. These solid state controls also show promise of long, maintenance-free lifetimes and high resistance to degrading environmental factors such as temperature, humidity and exposure to dirt and grease. These features are important considerations with regard to controls for laundry and related machinery or other equipment operating under similar environmental conditions.

Accordingly, a need is perceived to exist for an electronic circuit which can be incorporated into a hermetically sealed container with a 550 watt "on" cycle subject to a nearly unlimited choice of time intervals and with the "on" cycle initiated by momentary closure of an external circuit with less than 10 volts of lead-to-lead potential and with less than one-half milliampere of current at the moment of circuit closure. It is believed that an electronic switching module with these characteristics will have a variety of industrial control applications.

SUMMARY OF THE INVENTION

Accordingly, a general object of this invention is to provide a novel and reliable electronic switching circuit for turning on a 550 watt, 115 volt AC resistive or inductive load for a predetermined time period after which power to the load is turned off without further action by the operator or user.

A specific object of the invention is to provide a switching circuit which can be hermetically encapsulated in a conveniently sized module.

Another object of the invention is to provide a switching module with six color-coded flexible leads to facilitate permanent connection of the module to the AC supply with correct polarity and to simplify connections to the load and control lines.

Other objects and further features of the invention will be apparent from the following detailed description of the preferred embodiments of the invention when read in conjunction with the accompanying drawings, in which:

DESCRIPTION OF THE PREFERRED EMBODIMENT

Figure 1:
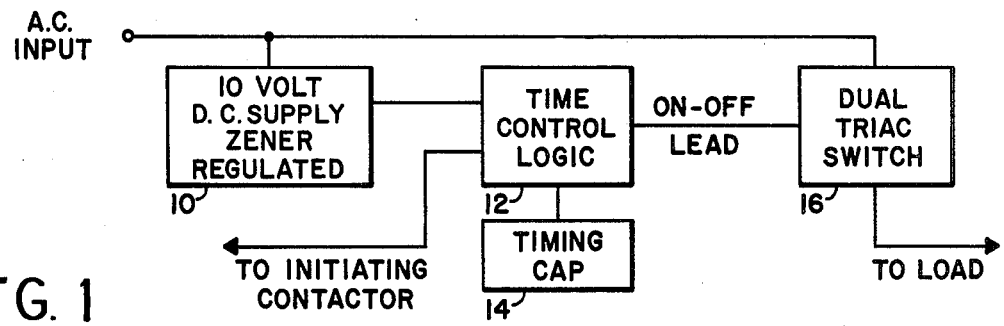
FIG. 1 is a functional block diagram of the inventive switching circuit.

The block diagram shown in FIG. 1 illustrates the basic functions of the switching circuit. The D.C. power supply 10 is derived from the AC input by means of a one-half wave rectifier circuit and dropping resistors. Part of the supply feeding an integrated circuit in control logic 12 and timing capacitor 14 is regulated to ten volts by a zener diode. The time control logic circuit 12 consists of a Quad two input Schmitt trigger NAND gate. Only three of the four gates in the IC are used. Two gates are connected to function as an R-S flip-flop. One gate is used to reset the flip-flop upon completion of an "on" cycle.

A COS/MOS NAND gate IC is used for this application because of its negligible quiescent current and because the regenerative character of the Schmitt trigger makes the set and reset switching modes stable and reliable. The timing capacitor 14 is a commercial grade 220 ufd. aluminum electrolytic capacitor. When used in conjunction with an adjustable resistor, capacitor 14 is large enough to provide an "on time" of up to 15 minutes. The dual triac switch 16 consists of a combination of a small current triac which turns on a 5 amp load control triac and keeps the power triac on until the time delay logic 12 signals that the "on" cycle is completed.

Figure 2:
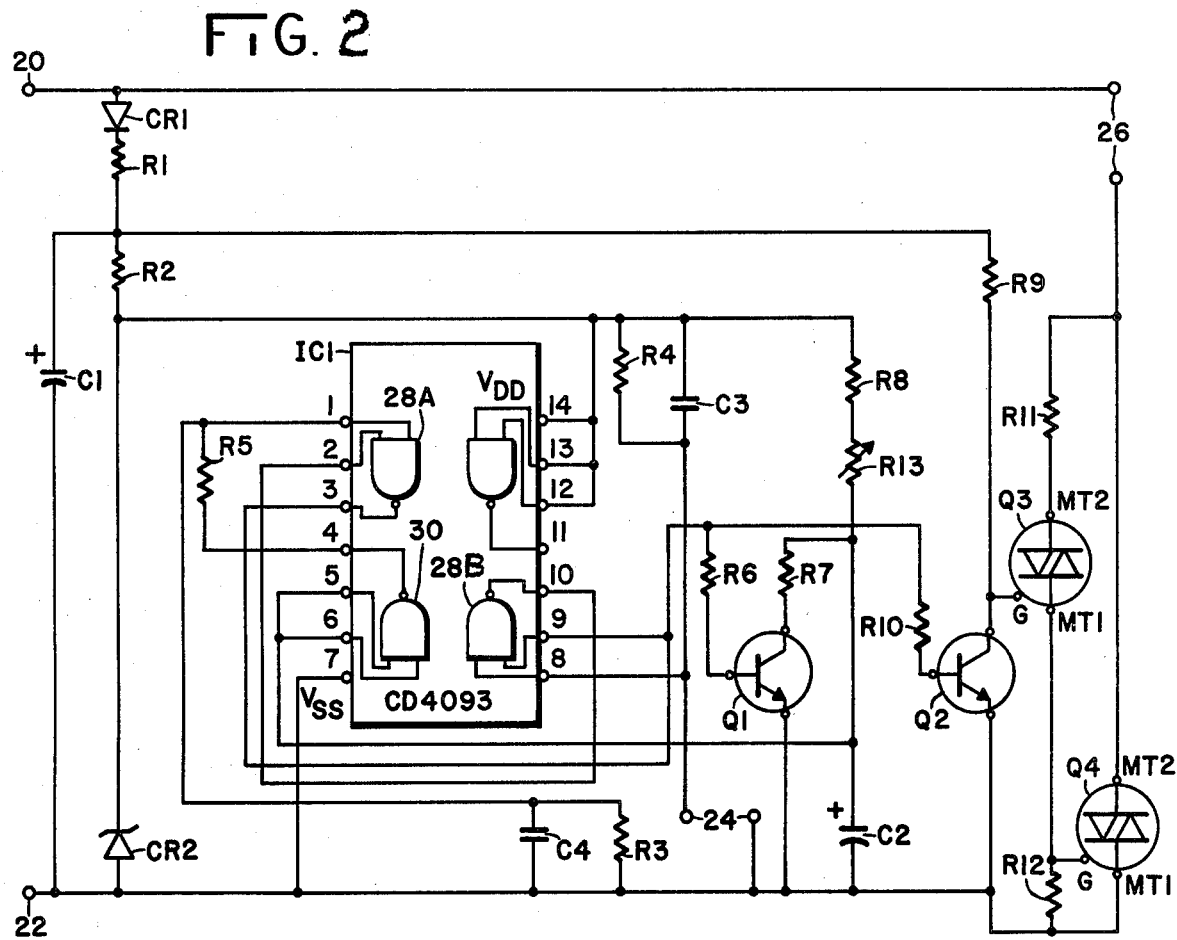
FIG. 2 is a detailed schematic diagram showing interconnections between and value of components used in the switching circuit.

A detailed schematic diagram of the switching circuit is shown in FIG. 2. Terminals for connection of the switching circuit to an AC source, a load and the control line are shown at 20 and 22, 26 and 24 respectively. A black lead is connected to terminal 20 which in turn is connected to the high or hot side of the 115 volt supply. A white lead connected to 22 is for connection to the neutral or low side of the AC supply source. The black supply connection must always be connected to the high side of the AC line. If the switching circuit is used in conjunction with a plug-in AC source, the plug should be polarized to prevent reverse connection of the AC line. The two terminals at 24 are for connection to a pair of green leads which are the "on" control lines. Momentary closure of the green leads turns the switching circuit on. The two terminals at 26 are connected to two red leads which serve the switched AC load.

The AC rail which extends from terminal 20 to one of the terminals at 26 is linked to the D.C. loads through, for example, a 1N4005 power diode CR1 and resistor R1 which is a 620 ohm ½ watt resistor supplying the unregulated D.C. voltage connected to the collector of transistor Q2 and the gate of driver triac Q3 through 18 k-ohm 1 watt, resistor R9. The unregulated D.C. supply is filtered by 1 ufd capacitor C1. C1 is a 150 volt electrolytic capacitor connected from D.C. plus to the ground rail and is also connected to the AC neutral at 22. The unregulated D.C. supply is connected to the regulated supply through 27 k-ohm regulator resistor R2. Voltage regulation is provided by CR2 which may be a 10 volt 1N5240A zener diode or alternatively a 1N758A zener diode connected between the regulated D.C. plus rail and ground.

The D.C. 10 volt supply is connected to integrated circuit IC-1 at pin 14($V_{DD}$). Circuit IC-1 is, for example, an RCA COS/MOS dual input quad NAND gate-type CD4093. The 10 volt supply is also connected to pin 8 of IC-1 through R4, a 33 k-ohm ¼ watt resistor which is shunted by a 0.01/uf 50 volt capacitor C3. Pin 8 is also connected to one terminal of the control circuit pair 24. The other terminal of the control circuit 24 is connected to the ground rail 22. Unused gate inputs at pins 12 and 13 of IC-1 are also connected to the regulated D.C. supply. Pin 11 of IC-1 is allowed to float. Pin 5 of IC-1 is connected to pin 6 which is also connected to the junction of 22 ohm resistor R7, 500 k-ohm adjustable resistor R13 and the positive terminal of a 220 ufd capacitor C2. Pin 1 of IC-1 is connected to pin 4 through a 33 k-ohm ¼ watt resistor. Pin 1 of IC-1 is also connected to the ground rail through R3 which is a 330 k-ohm ¼ watt resistor shunted by a 0.01 ufd 50 volt capacitor C4. Pin 2 of IC-1 is connected to pin 10. Pin 3 of IC-1 is connected to pin 9. Pin 9 is also connected to the base of transistor Q1 through R6 which is a 68 k-ohm ¼ watt resistor and to the base of transistor Q2 through R10 which is a 68 k-ohm resistor.

Transistors Q1 and Q2 are NPN-type such as a 2N5088, or alternatively a MPSA05. The regulated 10 volt supply is connected to the positive terminal of C2 through R8 and R13. The negative terminal of C2 is connected to the ground rail. Resistor R13 is a 500 k-ohm adjustable resistor and R8 is a 560 k-ohm ¼ watt resistor. Capacitor C2 is a 220 ufd 10 volt electrolytic capacitor which serves as the storage capacitor to control the "on time" of the switching circuit. The positive terminal of C2 is connected to the collector of Q1 through a 22 ohm ¼ watt resistor R7.

As previously stated, the positive terminal of C2 is also connected to pin 5 and pin 6 of IC-1. The emitter of Q1 and the emitter of Q2 are both connected to the ground rail 22. Terminal MT1 of driver or pilot triac Q3 is connected to the ground rail through a 1000 ohm ¼ watt resistor R12. MT1 of driver triac Q3 is also connected to the gate of output triac Q4. Terminal MT1 of the output triac is connected to the ground rail. MT2 of the output triac is connected to the low side of the pair of controlled output terminals 26. MT2 of the output triac Q4 is also connected to MT2 of the driver triac Q3 through a 100 ohm ¼ watt resistor R11. Driver triac Q3 is, for example, a type L200E3 by TECCOR and output triac Q4 is, for example, a type Q2015L5 also by TECCOR.

The output triac Q4 is housed in a plastic flat pack counterpart of the TO66. The triac pellet is electrically insulated but thermally coupled to the metal heat radiator support element. For this reason, the output triac Q4 is mounted on the underside of the printed circuit board, so the metal heat radiator is flush with the bottom of the encapsulated switching circuit. When the switching module is bolted in place, any metal mounting surface serves as a heat sink. Resistors used in the switching circuit assembly have a tolerance of 5%.

Figure 3:
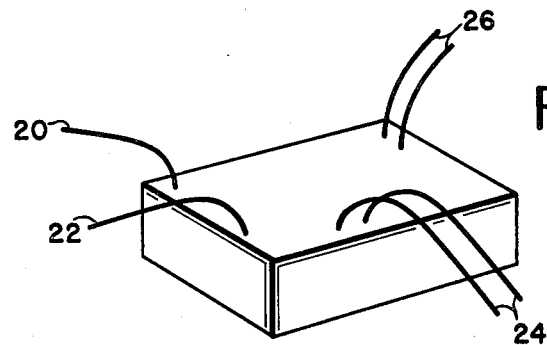
FIG. 3 is a perspective view of the encapsulated module containing the switching circuit.

The potting cup used to house the switching circuit printed circuit board is shown in FIG. 3. A high quality, non-hygroscopic, high dielectric two-part epoxy potting compound is used for encapsulation. The black AC (hot) lead is shown at 20. The white AC neutral lead is shown at 22. The green pair for the "on" contactor is shown at 24 and the red lead connection wires are shown at 26.

MODE OF OPERATION

As mentioned in the specification which describes the schematic diagram shown in FIG. 2, operation of the switching circuit is based on two Schmitt trigger NAND gates connected as an R-S flip-flop which is set by a momentary ground on one input and reset by a third NAND gate connected to perform the transfer function. The flip-flop circuit is made up of two dual input gates in IC-1, 28A and 28B in FIG. 2. Gate input pin 1 is connected to the ground rail through a 330 k-ohm resistor R3 shunted by a 0.01 ufd capacitor C4 and also to pin 4 of transfer gate 30 through resistor R5, 33 kilo-ohms. Gate input pin 2 is connected to pin 10, the output of the opposite gate 28B. The output pin 3 of gate 28A is connected to input pin 9 of gate 28B and to the bases of transistors Q1 and Q2 through resistors R6 and R10, each 66 k-ohms. The other input, pin 8 of gate 28B is connected to the regulated 10 volt supply through a 33 kilo-ohms resistor R4 shunted by 0.01 ufd capacitor C3. Pins 5 and 6 of transfer gate 30 are connected to the positive terminal of the 220 ufd. timing capacitor C2. The 10 volt regulated DC is applied to pin 14 ($V_{DD}$) of IC-1 and pin 7 is connected to the ground rail ($V_{SS}$).

Power consumed internally by the switching circuit which is mainly current through zener diode CR-2 and current through transistors Q1 and Q2 and gate current to driver triac Q3 is less than ten milliamps in both the "off" and the "on" modes. Current consumed by the CMOS integrated circuit is negligible. The largest source of heat on the printed circuit board is from the voltage drop in resistor R9.

In the "off" or "standby" mode, the output of gate 28A (pin 3) is at 10 volts positive as is the input (pin 9) of gate 28B. The high output at pin 3 of gate 28A is applied to the bases of transistors Q1 and Q2 which are biased into heavy conduction. The voltage at the positive terminal of timing capacitor C2 is very nearly zero and the voltage at the collector of transistor Q2 is too low to trigger the gate of triac Q3 which holds triac Q4 off and keeps the AC load connected to 26 isolated.

As mentioned, pin 8, the second input to gate 28B is connected to the regulated 10 volt supply through resistor R4; thus, it has a voltage of nine volts in both the "off" and "on" circuit modes. Pin 8 also provides the means for switching the circuit on, and for this reason pin 8 is connected to one side of the control line 24 (FIG. 2). The other control line lead is connected to the ground rail.

A momentary ground on pin 8 (on the order of one to ten milliseconds) will cause gate 28B to conduct, so output pin 10 goes to 10 volts. Pin 10 which is connected to pin 2 of gate 28A shuts off 28A so pin 3, the output of gate 28A, goes to zero volts thus removing the positive voltage from the base of transistors Q1 and Q2. Thus, a voltage appears at the gate of triac Q3 sufficient to turn on Q3 which in turn switches on power triac Q4 and activates whatever AC load is connected to output 26 (FIG. 2). With the base voltage removed from transistor Q1, the external loading on timing capacitor C2 is greatly reduced. The voltage on capacitor C2 which is derived from the 10 volt regulated supply through resistors R8 and R13 starts to rise. When the voltage on C2 which is also applied to pins 5 and 6 of the transfer gate 30 reaches about 6 volts, the output (pin 4) of transfer gate 30 goes low.

Pin 4 is connected to input pin 1 of gate 28A through 33 k-ohm resistor 5. When pin 1 of gate 28A goes low, the gate output at pin 3 goes to nine volts. Pin 3 of gate 28A is connected to input pin 9 of gate 28B which is simultaneously turned off. The positive voltage on pin 3 which is also connected to the bases of transistors Q1 and Q2 switches them into conduction, removing the residual voltage on timing capacitor C2 and on pin 5 and 6 of the transfer gate whose output, pin 4 goes high. Conduction in transistor Q2 removes the gate voltage on triac Q3 which switches off triac Q4, disconnecting the A.C. load. The switching circuit is thus returned to the initial "off" or "standby" mode available for reactivation by a momentary contact across control terminals 24 (FIG. 2).

While the invention has been particularly shown and described with reference to a preferred embodiment thereof, it will be understood by those skilled in the art that changes in the form and details may be made therein without departing from the spirit and scope of the invention. For example, by substitution of a larger power triac at Q4, it would be possible to increase the maximum of AC current controlled to 25 or more amperes with only a minimum of modifications to the printed circuit board used as a basis for the switching circuit module. Additionally, as described in the specification, the combination of resistors R8 and R13 with timing capacitor C2, permit an AC load "on" time of 5 to 15 minutes to be preselected by adjustment of R13 prior to encapsulation of the module. Other combinations of C2 and R8 will permit considerable latitude in selection of longer or shorter "on" times for various applications. Arrangements for facilitating adjustment of circuit "on" time after or during installation can be made by installing an insulating bushing over the screw driver adjustment on R13, so it can be adjusted after the circuit is potted. A plug of silicone wax could then be used to keep moisture and dirt out of the R13 adjustment hole.

I claim:

1. An electronic circuit for controlling the application of AC power to a load, comprising:
   switching means for placing said circuit in "on" and "off" modes, said AC power being applied to said load during the "on" mode;
   first means coupled to said switching means for controlling the duration of the "on" mode, said first means comprising:
   a first transistor having a base coupled to said switching means;
   a timing capacitor coupled to the collector of said first transistor, which timing capacitor is charged to a predetermined voltage when a positive voltage on the base of said first transistor is removed by said switching means, said capacitor triggering said switching means into its "off" mode when said predetermined voltage is reached; and
   resistive means coupled to said timing capacitor for controlling its rate of charge; and
   second means coupled to said first means and responsive to said switching means for applying said AC power to said load, said second means comprising:
   a power triac coupled to said load;
   a pilot triac coupled to said power triac for switching said power triac on and off; and
   a second transistor coupled to said pilot triac and to said switching means for turning said pilot triac on.

2. A circuit according to claim 1 wherein said resistive means includes a variable resistor.

3. A circuit according to claim 2 wherein said switching means includes a flip-flop comprising first and second NAND gates.

4. A circuit according to claim 3 wherein said switching means is reset by a third NAND gate having inputs coupled to said timing capacitor and an output coupled to said flip-flop.

5. A circuit according to claim 4 wherein said switching means is placed in its "on" mode by the momentary connection of two wires having contact terminals.

6. A circuit according to claim 5 wherein said terminals are located at some point remote from said switching means.

7. A circuit according to claim 6 wherein said circuit is hermetically encapsulated.

* * * * *